US 8,848,760 B2

(12) United States Patent
Vahala et al.

(10) Patent No.: US 8,848,760 B2
(45) Date of Patent: Sep. 30, 2014

(54) ON-CHIP OPTICAL REFERENCE CAVITY EXHIBITING REDUCED RESONANCE CENTER FREQUENCY FLUCTUATIONS

(71) Applicant: California Institute of Technology, Pasadena, CA (US)

(72) Inventors: Kerry Vahala, Pasadena, CA (US);
Tong Chen, Pasadena, CA (US);
Hansuek Lee, Pasadena, CA (US);
Myoung-Gyun Suh, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 52 days.

(21) Appl. No.: 13/831,692

(22) Filed: Mar. 15, 2013

(65) Prior Publication Data
US 2014/0105232 A1 Apr. 17, 2014

Related U.S. Application Data

(60) Provisional application No. 61/656,285, filed on Jun. 6, 2012.

(51) Int. Cl.
*H01S 3/08* (2006.01)
(52) U.S. Cl.
USPC .............................................. 372/92; 385/129
(58) Field of Classification Search
CPC ....... H01S 3/0315; H01S 3/063; H01S 5/026; H01S 5/0268; H01S 5/1003; H01S 5/1243
USPC ........................................ 372/9, 39; 385/129
See application file for complete search history.

(56) References Cited

U.S. PATENT DOCUMENTS

| 5,398,256 A | 3/1995 | Hohimer et al. |
| 7,616,850 B1 | 11/2009 | Watts et al. |
| 7,929,589 B1 | 4/2011 | Ilchenko et al. |
| 8,045,834 B2 * | 10/2011 | Painter et al. ................. 385/129 |
| 8,094,987 B2 * | 1/2012 | Martin Armani ............ 385/129 |
| 2004/0179573 A1 | 9/2004 | Armani et al. |
| 2008/0203052 A1 | 8/2008 | Hossein-Zadeh et al. |

(Continued)

FOREIGN PATENT DOCUMENTS

KR  10-0796258 B1  1/2008

OTHER PUBLICATIONS

Li et al; Chip-based Frequency Comb with Microwave Repetition Rate; Frontiers in Optics Meeting, Paper # FWB2 (2011).

(Continued)

*Primary Examiner* — Tuan Nguyen
(74) *Attorney, Agent, or Firm* — David S. Alavi

(57) ABSTRACT

An optical apparatus comprises a waveguide substrate and an optical reference cavity. The optical reference cavity comprises an optical waveguide formed on the waveguide substrate and arranged to form a closed loop greater than or about equal to 10 cm in length. The RMS resonance frequency fluctuation is less than or about equal to 100 Hz. The Q-factor can be greater than or about equal to $10^8$. The optical waveguide can exhibit optical loss less than or about equal to 0.2 dB/m for propagation of an optical signal along the optical waveguide. The closed loop path can comprise two or more linked spirals greater than or about equal to 1 meter in length and can occupy an area on the waveguide substrate less than or about equal to 5 $cm^2$.

22 Claims, 5 Drawing Sheets

(56) References Cited

U.S. PATENT DOCUMENTS

| | | |
|---|---|---|
| 2009/0028504 A1 | 1/2009 | Wu et al. |
| 2009/0285542 A1 | 11/2009 | Martin Armani et al. |
| 2012/0320448 A1 | 12/2012 | Li et al. |
| 2012/0321245 A1 | 12/2012 | Vahala et al. |

OTHER PUBLICATIONS

Armani et al; Ultra-high-Q toroid microcavity on a chip; Nature 421, 925-929 (Feb. 27, 2003).

Papp et al; Spectral and temporal characterization of a fused-quartz-microresonator optical frequency comb; Phys. Rev. A. 84, 053833 (2011).

Kippenberg et al; Microresonator-Based Optical Frequency Combs; Science 332, 555-559 (Apr. 29, 2011).

Carmon et al; Dynamical thermal behavior and thermal self-stability of microcavities; Optics Express 12, 4742 (Oct 4, 2004).

Hänsch et al; Laser frequency stabilization by polarization spectroscopy of a reflecting reference cavity; Opt. Commun. 35, 441-444 (Dec. 1980).

Drever et al; Laser phase and frequency stabilization using an optical resonator; Appl Phys B 31(2), 97 (1983).

Udem et al; Optical frequency metrology; Nature 416, 233 (Mar. 14, 2002).

International Search Report and Written Opinion dated Jul. 26, 2013 in counterpart App No. PCT/US2013/032717.

Lee, et al; Chemically etched ultrahigh-Q wedge-resonator on a silicon chip; Nature Photonics 6, 369 (May 20, 2012).

Lee et al; Ultra-low-loss optical delay line on a silicon chip; Nature Communications 3, 867 (May 29, 2012).

Lee et al; Ultra-high-Q wedge-resonator on a silicon chip; arXiv:1112.2196v1 (2011).

Lee et al; Ultra-High-Q Micro-Cavity on a Silicon Chip; Frontiers in Optics Meeting, Paper # FWS2 (2011).

Xu et al; Folded cavity SOI microring sensors for high sensitivity and real time measurment of biomolecular binding; Optics Express 16, 15137 (2008).

Xu et al: Archimedean spiral cavity ring resonators in silicon as ultra-compact optical comb filters; Optics Express 18, 1937 (2010).

Gorodetsky et al; Fundamental thermal fluctuations in microspheres; J. Opt. Soc. Am. B 21, 697-705 (2004).

Alnis et al; Thermal-noise limited laser stabilization to a crystalline whispering-gallery-mode resonator, arXiv:1102.4227v1 (Feb. 21, 2011).

Black; An introduction to Pound—Drever—Hall laser frequency stabilization; Am J Phys 69(1), 79 (2001).

\* cited by examiner

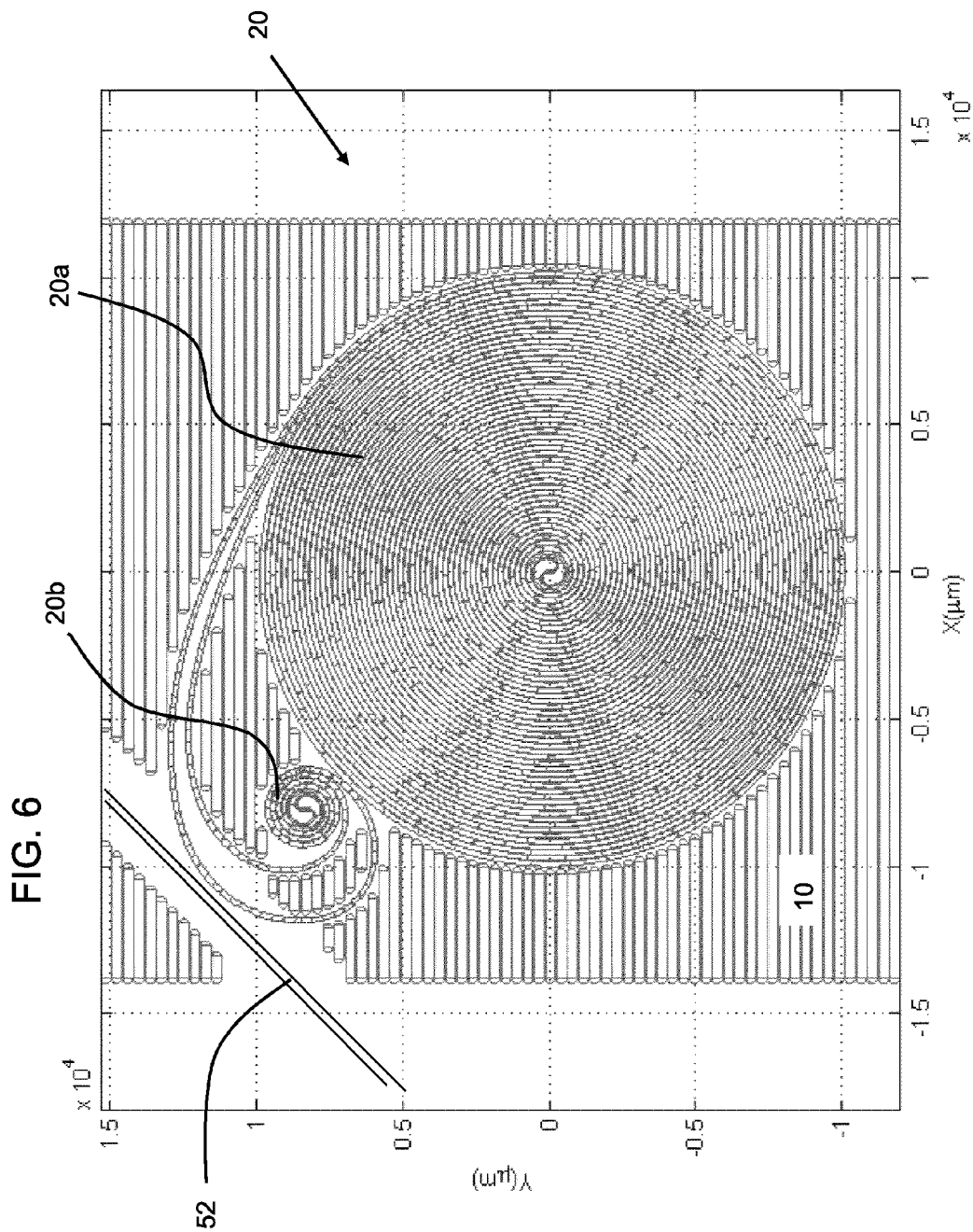

ON-CHIP OPTICAL REFERENCE CAVITY EXHIBITING REDUCED RESONANCE CENTER FREQUENCY FLUCTUATIONS

BENEFIT CLAIMS TO RELATED APPLICATIONS

This application claims benefit of U.S. provisional App. No. 61/656,285 filed Jun. 6, 2012 in the names of Kerry Vahala, Tong Chen, Hansuek Lee, and Myoung-Gyun Suh, said provisional application being hereby incorporated by reference as if fully set forth herein.

STATEMENT REGARDING FEDERALLY SPONSORED RESEARCH

This invention was made with government support under FA9550-10-1-0284 awarded by the Air Force and under HR0011-09-C-0122 awarded by DARPA. The government has certain rights in the invention.

BACKGROUND

The field of the present invention relates to optical reference cavities. In particular, on-chip optical reference cavities are disclosed that exhibit reduced thermorefractive, thermomechanical, or photothermal frequency fluctuations.

The subject matter of the instant application may be related to or enabled by subject matter disclosed in one or more of the following references, each of which is incorporated by reference as if fully set forth herein:

- U.S. Pub. No. 2012/0321245 entitled "Silica-on-silicon waveguides and related fabrication methods" published Dec. 20, 2012 in the names of Vahala et al;
- U.S. Pub. No. 2012/0320448 entitled "Chip-based frequency comb generator with microwave repetition rate" published Dec. 20, 2012 in the names of Li et al;
- U.S. Pat. No. 8,094,987 entitled "Silica-on-silicon waveguides and related fabrication methods" issued Jan. 10, 2012 to Martin Armani;
- U.S. Pat. No. 8,045,834 entitled "Silica-on-silicon waveguides and related fabrication methods" issued Oct. 25, 2011 to Painter et al;
- U.S. Pub. No. 2009/0285542 entitled "Silica-on-silicon waveguides and related fabrication methods" published Nov. 19, 2009 in the names of Martin Armani et al;
- U.S. Pub. No. 2008/0203052 entitled "Method of fabricating a microresonator" published Aug. 28, 2008 in the names of Hossein-Zadeh et al;
- U.S. Pub. No. 2004/0179573 entitled "Ultra-high Q microresonator and method of fabrication" published Sep. 16, 2004 in the names of Armani et al;
- Hansuek Lee, Tong Chen, Jiang Li, Ki Youl Yang, Seokmin Jeon, Oskar Painter, and Kerry J. Vahala, "Chemically etched ultrahigh-Q wedge-resonator on a silicon chip," Nature Photonics 6, 369 (20 May 2012);
- Hansuek Lee, Tong Chen, Jiang Li, Oskar Painter, & Kerry J. Vahala, "Ultra-low-loss optical delay line on a silicon chip," Nature Communications 3, 867 (29 May 2012);
- H. Lee, T. Chen, J. Li, K. Yang, S. Jeon, O. Painter, and K. Vahala, "Ultra-high-Q wedge-resonator on a silicon chip," arXiv:1112.2196v1 (2011);
- J. Li, H. Lee, T. Chen, K. J. Vahala, "Chip-based Frequency Comb with Microwave Repetition Rate," Frontiers in Optics Meeting, Paper # FWB2 (2011);
- H. Lee, T. Chen, J. Li, O. Painter, and K. Vahala, "Ultra-High-Q Micro-Cavity on a Silicon Chip," Frontiers in Optics Meeting, Paper # FWS2 (2011);
- D. K. Armani, T. J. Kippenberg, S. M. Spillane and K. J. Vahala, "Ultra-high-Q toroid microcavity on a chip," Nature 421, 925-929 (2003);
- S. B. Papp and S. A. Diddams, "Spectral and temporal characterization of a fused-quartz-microresonator optical frequency comb," Phys. Rev. A. 84, 053833 (2011);
- T. J. Kippenberg, R. Holzwarth, and S. A. Diddams, "Microresonator-Based Optical Frequency Combs," Science 332, 555-559 (2011);
- Xu et al, "Archimedean spiral cavity ring resonators in silicon as ultra-compact optical comb filters," Optics Express 18, 1937 (2010);
- T. Cannon, L. Yang, and K. J. Vahala, "Dynamical thermal behavior and thermal self-stability of microcavities," Optics Express 12, 4742 (2004);
- Gorodetsky, M. L. & Grudinin, I. S., "Fundamental thermal fluctuations in microspheres," J. Opt. Soc. Am. B 21, 697-705 (2004);
- J. Alnis, A. Schliesser, C. Y. Wang, J. Hofer, T. J. Kippenberg, and T. W. Hänsch, "Thermal-noise limited laser stabilization to a crystalline whispering-gallery-mode resonator," arXiv:1102.4227v1 (21 Feb. 2011);
- Hänsch, T. & Couillaud, B., "Laser frequency stabilization by polarization spectroscopy of a reflecting reference cavity," Opt. Commun. 35, 441-444 (1980);
- R. W. P. Drever, J. L. Hall, F. V. Kowalski, J. Hough, G. M. Ford, A. J. Munley, and H. Ward, "Laser phase and frequency stabilization using an optical resonator," Appl Phys B 31(2), 97 (1983);
- Eric D. Black, "An introduction to Pound-Drever-Hall laser frequency stabilization," Am J Phys 69(1), 79 (2001); and
- T. Udem, R. Holzwarth and T. W. Hänsch, "Optical frequency metrology," Nature 416, 233 (2002).

There exist many devices and techniques in which an optical reference cavity is employed as a frequency reference. One application of particular interest is locking the output frequency of a laser source to an optical resonance frequency of an optical reference cavity 20 (FIG. 1). A variety of schemes have been developed to achieve such locking. Examples include, inter alia, the Hänsch-Couillaud method and the Pound-Drever-Hall method.

Any resonant optical cavity exhibits multiple resonance frequencies that are spaced by the cavity's free spectral range, which is in turn determined by the optical pathlength of the reference cavity over an operational frequency range (equivalently, an operational wavelength range). Over typical operational wavelength ranges (e.g., a few tens or hundreds of nanometers at so-called optical frequencies), the multiple resonance frequencies can be regarded as substantially uniformly spaced in frequency. The linewidth of the resonances of the reference cavity in part determine the utility of the cavity as a frequency reference. Narrower resonant linewidth results in improved precision of frequency measurement or control using the optical reference cavity. The linewidth is mainly determined by the so-called Q-factor of the optical reference cavity, which is in turn determined primarily by the total round-trip optical loss of the reference cavity. Reference cavity Q-factors exceeding $10^8$ and approaching $10^9$ have been demonstrated in optical reference cavities comprising a closed-loop dielectric waveguide formed on a substrate chip; some examples are disclosed in one or more of the preceding references. Such large Q-factors can yield, for example as shown in FIG. 2, frequency linewidths of only a few hundred kHz (or even down to several tens of kHz) at optical frequencies on the order of $2\times10^{14}$ Hz (i.e., wavelengths around 1500 nm).

Frequency linewidth is not the only determinant of a reference cavity's utility as a frequency reference. Because the optical pathlength of the reference cavity depends on the effective index of the corresponding cavity optical mode and the physical length of the cavity, the multiple resonance frequencies are temperature dependent. Use of an optical reference cavity therefore requires temperature control and stabilization to maintain a sufficiently stable frequency reference. As requirements for the stability of a frequency reference become more and more stringent, however, simple thermal control and stabilization of an optical reference cavity may not be sufficient. Even if the optical reference cavity is maintained at a perfectly invariant bulk temperature, variations or fluctuations in the center frequency of each of the multiple cavity resonances can occur (as in FIG. 3) and can arise from one of several sources. A first source of such fluctuations is the occurrence of localized, transient, statistical fluctuations in the temperature of the reference cavity (i.e., so-called thermorefractive noise). A second source of resonance center frequency fluctuations is the thermal excitation of relatively high frequency (e.g., on the order of 1-100 MHz) vibrational modes of the reference cavity or its supporting structures and coupling of those vibrational modes to the optical modes supported by the reference cavity (i.e., so-called thermomechanical noise). A third source of resonance center frequency fluctuations is the absorption of light circulating in the reference cavity by localized, random defects in the optical material of the reference cavity, which in turn causes localized, intensity dependent heating of the reference cavity (i.e., so-called photothermal noise). These three are major sources of frequency fluctuations in an optical reference cavity realized as a closed-loop dielectric waveguide formed on a substrate chip. Because such on-chip optical reference cavities are desirable for various reasons (e.g., compactness, robustness, manufacturability), it would be desirable to provide on-chip optical reference cavities that exhibit reduced center frequency fluctuations.

SUMMARY

An optical apparatus comprises a waveguide substrate and an optical reference cavity. The optical reference cavity exhibits multiple resonance frequencies over an operational wavelength range and can be characterized over the operational wavelength range by a Q-factor and a RMS resonance frequency fluctuation. The optical reference cavity comprises an optical waveguide formed on the waveguide substrate and arranged to form a closed loop greater than or about equal to 10 cm in length. The RMS resonance frequency fluctuation is less than or about equal to 100 Hz. The Q-factor can be greater than or about equal to $10^8$. The optical waveguide can exhibit optical loss less than or about equal to 0.2 dB/m for propagation of an optical signal along the optical waveguide. The closed loop path can comprise two or more linked spirals greater than or about equal to 1 meter in length and can occupy an area on the waveguide substrate less than or about equal to 5 cm$^2$.

A method employing the optical reference cavity comprises: (i) operating a laser source to produce an output optical signal; (ii) coupling a portion of the output optical signal to the optical reference cavity; (iii) generating an error signal based on the interaction of the coupled portion of the optical signal with the optical reference cavity; and (iv) controlling one or more operating parameters of the laser source based on the error signal so as to lock an optical frequency of the optical signal to one of the resonance frequencies of the optical reference cavity.

Objects and advantages pertaining to on-chip optical reference cavities may become apparent upon referring to the exemplary embodiments illustrated in the drawings and disclosed in the following written description or appended claims.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 5 is a schematic transverse cross section of an optical waveguide structure used to form an optical reference cavity.

FIG. 6 is a schematic top view of two pairs of interleaved spiral optical waveguides formed on a waveguide substrate and joined to form a closed-loop optical reference cavity.

Figure 1:
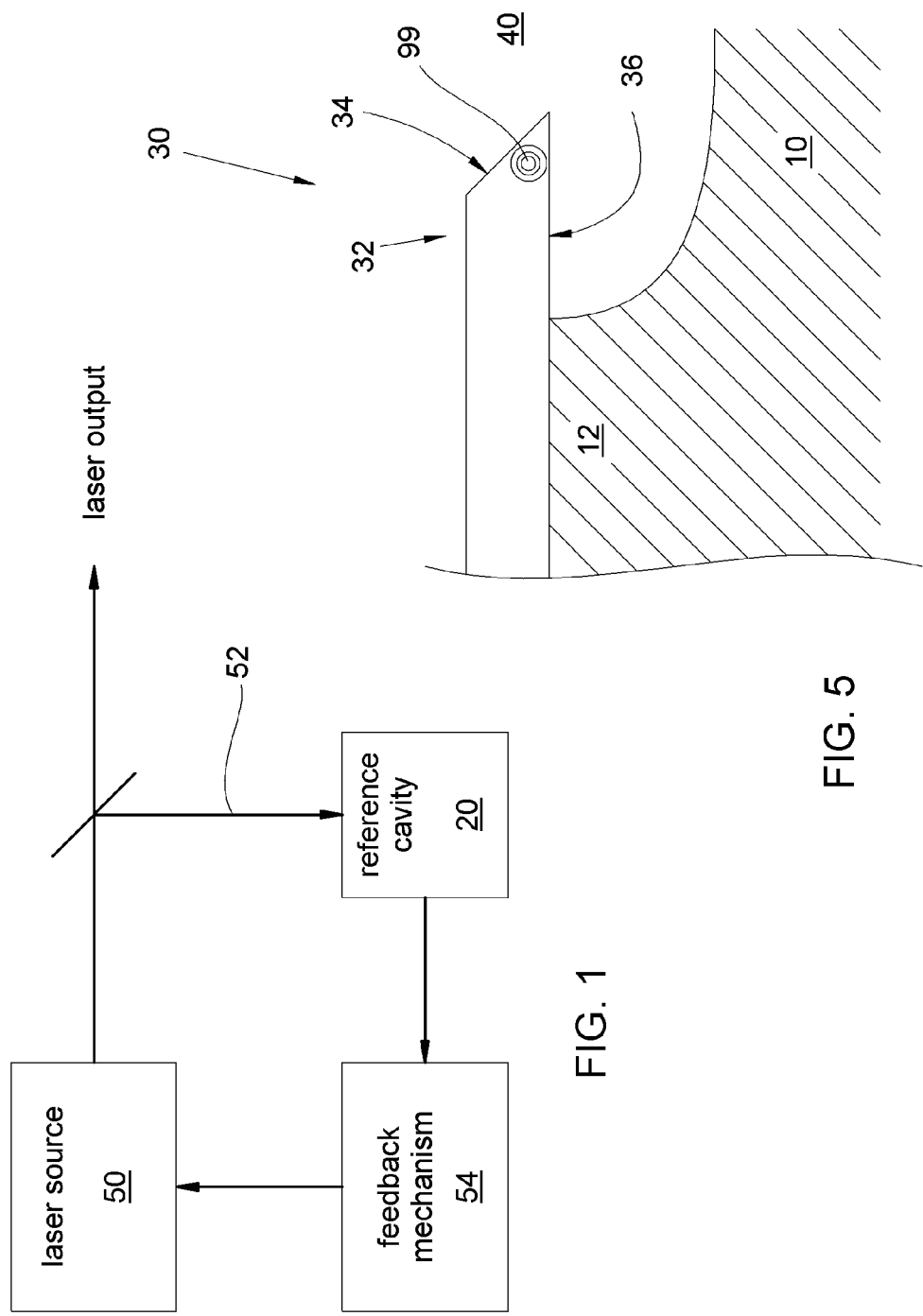
FIG. 1 is a schematic block diagram of a frequency-stabilized laser source employing an optical reference cavity.
Figure 2:
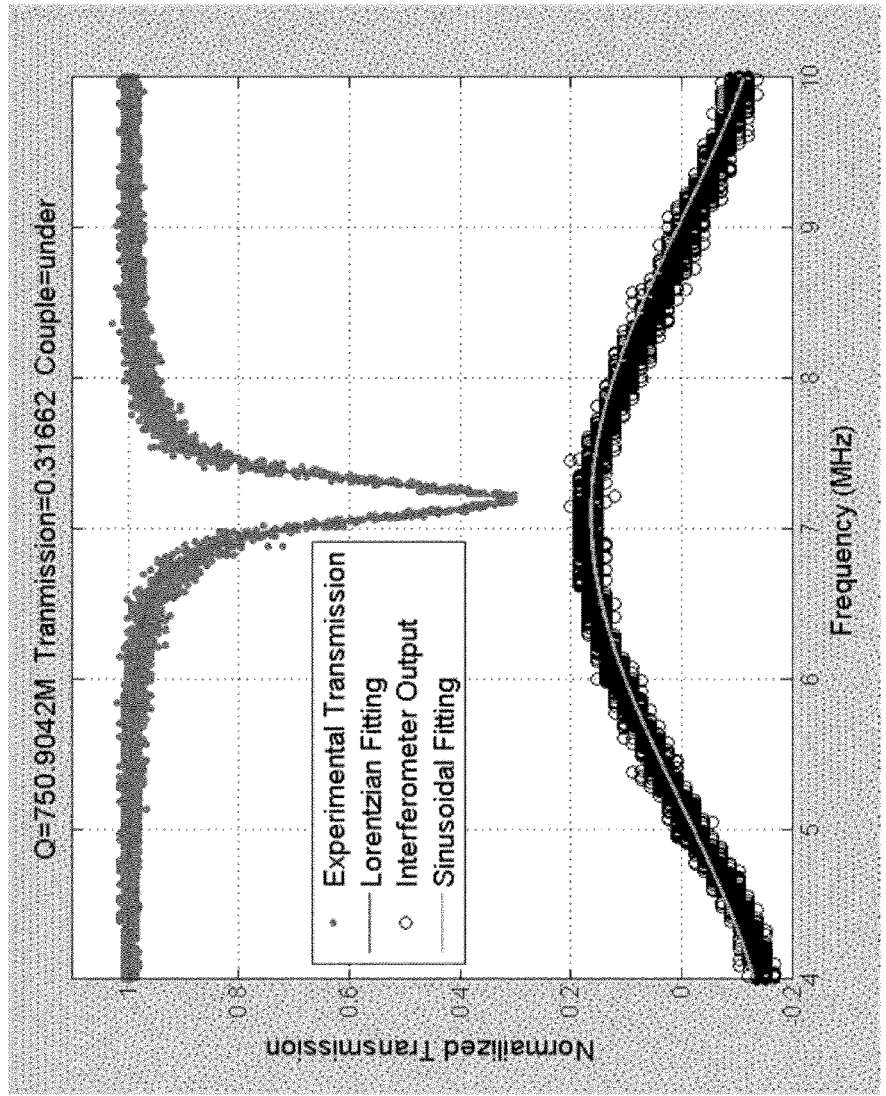
FIG. 2 is a plot of one resonant frequency of an optical reference cavity having a Q-factor of about $7.5\times10^8$.
Figure 3:
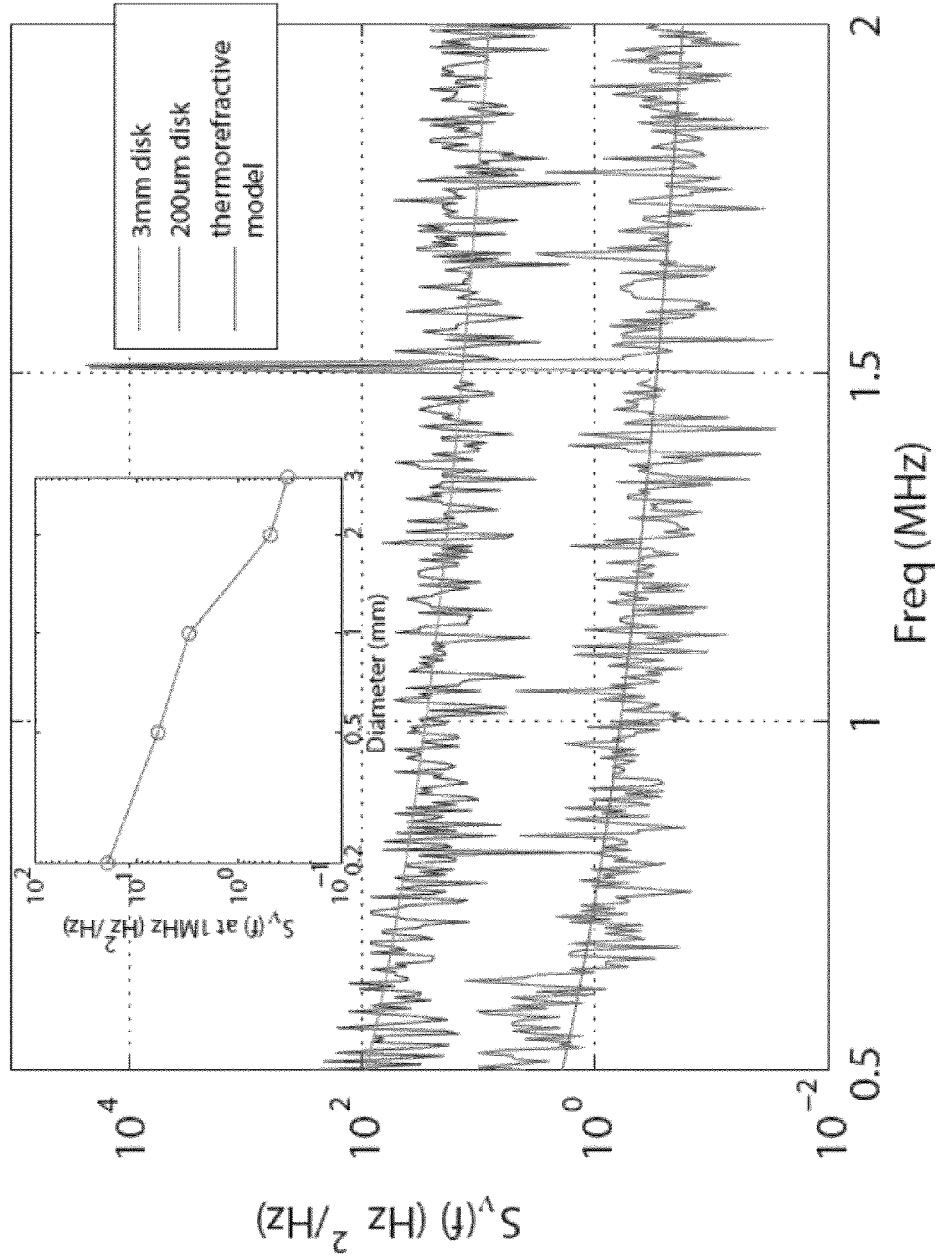
FIG. 3 includes frequency fluctuation spectra for two different size optical reference cavities illustrating decreased fluctuations of the center frequency with increasing reference cavity length.

It should be noted that the embodiments depicted in this disclosure are shown only schematically, and that not all features may be shown in full detail or in proper proportion. Certain features or structures may be exaggerated relative to others for clarity. For example, the actual spiral waveguides depicted schematically as having a handful of turns might have dozens, hundreds, or even thousands of turns; the number of turns is reduced in the drawings for clarity. Terms such as horizontal, vertical, up, down, top, bottom, upper, lower, above, below, and so forth are defined relative to the waveguide substrate (which is considered to be below the waveguide). Terms such as lateral, medial, transverse, and longitudinal are defined locally relative to the local optical propagation direction along the waveguide (which is considered to be longitudinal). It should be noted further that the embodiments shown are only examples, and should not be construed as limiting the scope of the written description or appended claims.

DETAILED DESCRIPTION OF EMBODIMENTS

An embodiment of an optical apparatus according to the present disclosure comprises a waveguide substrate 10 and an optical reference cavity 20 formed on the substrate 10. The optical reference cavity 20 comprises an optical waveguide 30 that is formed on the waveguide substrate 10 and arranged to form a closed loop greater than or about equal to 1 meter in length. The optical reference cavity 20 exhibits multiple resonance frequencies over an operational wavelength range, and can be characterized over the operational wavelength range by a Q-factor and a RMS resonance frequency fluctuation. In accordance with the present disclosure, the Q-factor of the optical reference cavity is greater than or about equal to $10^8$, and the RMS resonance frequency fluctuation is less than or about equal to 100 Hz.

Figure 4:
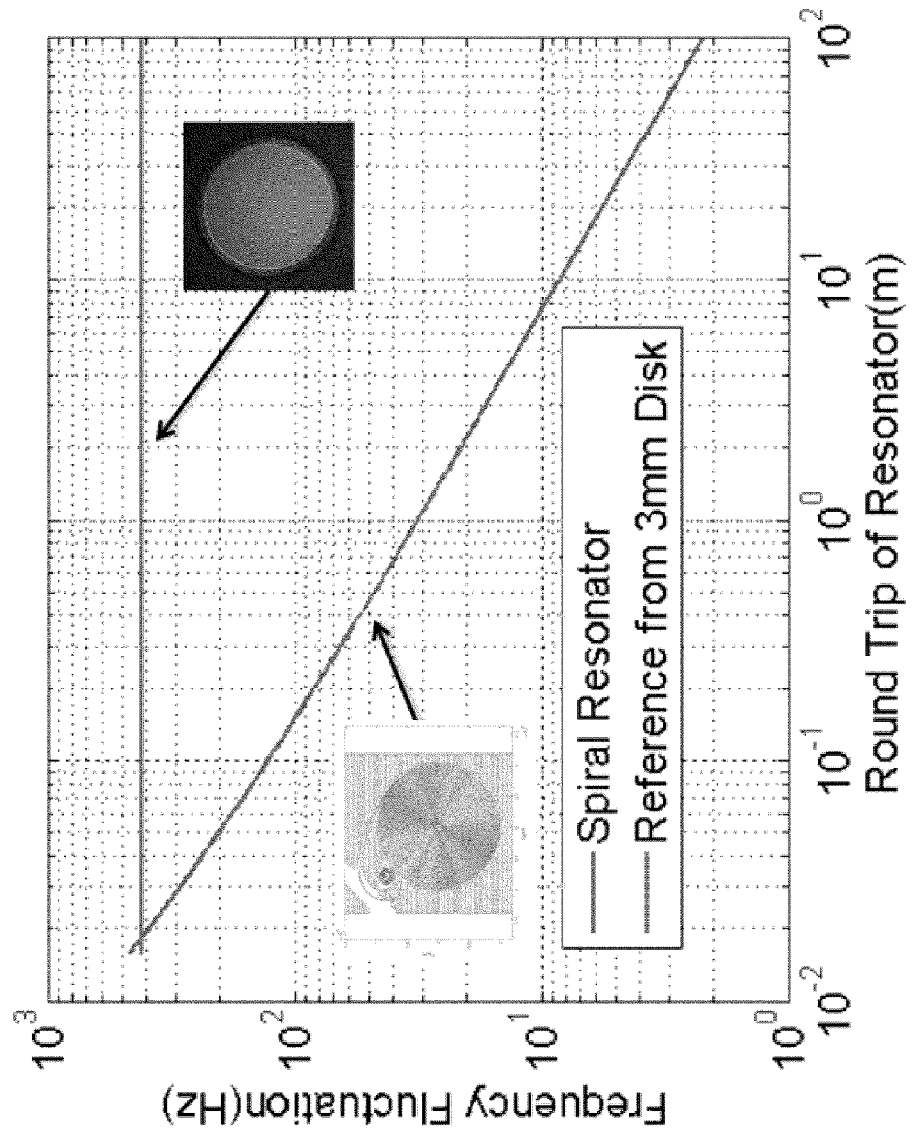
FIG. 4 shows expected variation of RMS frequency fluctuation with respect to reference cavity length.

In general, any suitable substrate material, waveguide material, or waveguide morphology can be employed provided the performance characteristics recited in the preceding paragraph are met. The center frequency noise is observed to scale inversely with respect to the mode volume of the corresponding resonant optical mode (as in FIG. 4), so lengthening the closed loop optical reference cavity decreases the resonance frequency fluctuations arising from thermorefractive noise, thermomechanical noise, or photothermal noise. A closed loop greater than or about equal to 1 meter in length yields a reduction in center frequency noise that achieves the RMS resonance frequency fluctuation that is less than or about equal to 100 Hz. At that length, an extremely low-loss waveguide typically must be employed to achieve a sufficiently large Q-factor, i.e., greater than or about equal to $10^8$. A waveguide morphology that exhibits optical loss less than or about equal to 0.2 dB/meter for propagation of an optical signal along the optical waveguide can be sufficient to yield a Q-factor of about $10^8$ or more in a resonator cavity that is about 1 meter long.

If needed or desired, more stringent performance parameters can be employed for the optical reference cavity. In some examples, the closed-loop waveguide can be greater than or about equal to 2 meters in length, greater than or about equal to 10 meters in length, or about equal to some other suitably chosen length (e.g., between about 1 and about 10 m or even longer). In some examples, reduction of center frequency noise by lengthening the optical reference cavity can yield RMS resonance frequency fluctuations less than or about equal to 20 Hz or less than or equal to about 10 Hz. In some examples, the reference cavity Q-factor can exceed about $2 \times 10^8$ or about $5 \times 10^8$, or can approach $10^9$, with corresponding narrowing of the resonance frequency linewidth for a given cavity length.

Any suitably low-loss waveguide morphology can be employed to achieve the desired Q-factor for a given reference cavity length, including, for example, a solid core material surrounded by a solid cladding or encapsulating material, or a solid core material surrounded by a gaseous ambient medium. Typically great care and attention are required to fabricate the optical waveguide to exhibit sufficiently low optical loss, e.g., less than about 0.2 dB/m, less than about 0.1 dB/m, less than about 0.05 dB/m, less than about 0.02 dB/m, or less than about 0.01 dB/m. Some examples of suitable optical waveguide materials or morphologies are disclosed in the preceding references.

In one specific group of examples (FIG. 5; see U.S. Pub. No. 2012/0321245 incorporated above), a transverse cross section of the optical waveguide 30 comprises a dielectric material supported by a pedestal or pillar 12 of substrate material. A lateral portion 32 of the dielectric material extends transversely beyond the pedestal 12 of the substrate material and an optical mode 99 of the optical reference cavity 20 is guided at least partly by an interface between the dielectric material and an ambient medium 40 at a lateral surface 34 of the extended portion 32 of the dielectric material. In some examples, the lateral surface 34 of the dielectric material forms an acute angle with a bottom surface 36 thereof. In some examples the ambient medium 40 is gaseous and comprises atmospheric or conditioned air (e.g., temperature-controlled or dehumidified), one or more inert gases (e.g., nitrogen or noble gas), or near vacuum (i.e., whatever residual gas composition and pressure remains after the volume containing the reference cavity has been evacuated by a suitably chosen pump). In some other examples the ambient medium can comprise a liquid, gel, or solid dielectric embedding medium, provided there is sufficient index contrast between the optical waveguide 30 and the ambient medium 40 to enable guiding of the optical mode 99 by the interface between the waveguide 30 and the ambient medium 40.

The substrate 10 commonly comprises one or more semiconductor materials and the dielectric material of waveguide 30 commonly comprises one or more oxide materials. In some examples, the low-index dielectric material comprises silica or doped silica between about 2 μm and about 10 μm thick, the substrate material comprises silicon or doped silicon, and the low-index dielectric material extends transversely more than about 70-80 μm beyond the pedestal of the substrate material. Optical waveguides formed within those parameters have exhibited optical loss less than or about equal to 0.2 dB/m and often much lower (see above) for propagation of the optical mode along the optical waveguide. In many of these examples, the operational wavelength range includes one or more portions of the visible or near infrared optical spectrum; other spectral regions can be employed if needed or desired.

For forming an on-chip optical reference cavity 20, it is desirable to reduce the area occupied by a cavity of a given length. The "area occupied" is not intended to include only the area of the substrate 10 that is literally covered by the waveguide 30, but is intended to include the entire area of the substrate 10 that is occupied by the reference cavity 20 so that other structures cannot be readily formed on portions of that area. For example, if the optical reference cavity 20 comprises a circular ring resonator, then the area "occupied" by the reference cavity is the entire area of the circle, not just the thin annular area covered by the waveguide 30. In some examples of an optical reference cavity 20, the closed loop path of the optical waveguide 30 (that is at least about 1 meter in length) comprises two or more linked spirals and occupies an area on the waveguide substrate less than or about equal to, e.g., 5 cm² (or even smaller in some examples). In another example, a reference cavity comprising multiple linked spirals and having a length of about 300 meters can be formed on a substrate area of about 300 cm². Increasing the density of the spiral waveguide (i.e., reducing the pitch of the spiral) can allow a longer cavity to occupy a given area, or a cavity of a given length to occupy a smaller area. The two linked spirals can be interleaved on the substrate and joined together to form a closed loop; two pairs of such interleaved spirals can be linked together to form a closed loop. In the example of FIG. 6, the two pairs 20a and 20b of interleaved spirals are different sizes, which can allow more efficient use of substrate area. Alternatively, the two pairs of interleaved spirals can be substantially the same size. In other examples, more than two pairs of interleaved spirals can be employed. At least a portion of one or more of the spirals in any of these examples can comprise an Archimedean spiral.

An optical apparatus according to the present disclosure can further comprise a laser source 50 and a second optical waveguide 52 (FIGS. 1 and 6). The second optical waveguide 52 is arranged so as to couple optically a portion of an optical signal emitted by the laser source 50 to the optical reference cavity 20. A feedback mechanism 54 of any suitable type (see above) produces an error signal based on the interaction between the coupled portion of the optical signal and the optical reference cavity 20. That error signal is used to control one or more operating parameters of the laser source so as to lock an optical frequency of the optical signal to one of the resonance frequencies of the optical reference cavity 20, thereby stabilizing the output optical frequency of the laser source 50. In some examples, the second optical waveguide 52 is formed on the waveguide substrate 10 along with the optical reference cavity 20. Typically such an integrally formed optical waveguide 52 is arranged to convey the optical signal to the optical reference cavity 20 by directional optical coupling of any suitable type (e.g., mode-interference coupling or adiabatic coupling; directional coupling is also sometimes referred to as transverse coupling). Integral formation of the optical reference cavity 20 and the second optical waveguide 52 can enable reproducible levels of optical coupling to be achieved between the optical reference cavity 20 and the second optical waveguide 52. In addition to reducing center frequency fluctuations arising from thermorefractive, thermomechanical, or photothermal noise, increasing the length of the reference cavity 20 (thereby increasing its mode volume) also increases the optical power level at which photothermal noise becomes significant. That in turn allows larger optical signals to be coupled into the reference cavity for improved performance of the feedback mechanism 54 without concomitant increase in photothermal noise.

It can be further advantageous also to form the laser source 50 on the same substrate 10 with the optical reference cavity 20 and the second optical waveguide 52. Such monolithic formation is particularly facilitated when the substrate 10 is a semiconductor and the laser source 50 is a semiconductor laser source.

In addition to the preceding, the following examples fall within the scope of the present disclosure or appended claims:

EXAMPLE 1

An optical apparatus comprising: (a) a waveguide substrate; and (b) an optical reference cavity that (i) exhibits multiple resonance frequencies over an operational wavelength range and (ii) can be characterized over the operational wavelength range by a Q-factor and a RMS resonance frequency fluctuation, wherein: (c) the optical reference cavity comprises an optical waveguide formed on the waveguide substrate and arranged to form a closed loop greater than or about equal to 10 cm in length; and (d) the RMS resonance frequency fluctuation is less than or about equal to 100 Hz.

EXAMPLE 2

The optical apparatus of Example 1 wherein: (c') the optical reference cavity comprises an optical waveguide formed on the waveguide substrate and arranged to form a closed loop greater than or about equal to 2 meters in length; (d') the RMS resonance frequency fluctuation is less than or about equal to 20 Hz; or (e') the Q-factor is greater than or about equal to $2\times10^8$.

EXAMPLE 3

The optical apparatus of Example 1 wherein: (c') the optical reference cavity comprises an optical waveguide formed on the waveguide substrate and arranged to form a closed loop greater than or about equal to 10 meters in length; (d') the RMS resonance frequency fluctuation is less than or about equal to 10 Hz; or (e') the Q-factor is greater than or about equal to $5\times10^8$.

EXAMPLE 4

The optical apparatus of Example 1 wherein the Q-factor is greater than or about equal to $10^8$.

EXAMPLE 5

The optical apparatus of Example 1 wherein the optical reference cavity comprises an optical waveguide formed on the waveguide substrate and arranged to form a closed loop greater than or about equal to 1 meter in length.

EXAMPLE 6

The optical apparatus of any preceding Example wherein the optical waveguide exhibits optical loss less than or about equal to 0.2 dB/m for propagation of an optical signal along the optical waveguide.

EXAMPLE 7

The optical apparatus of any preceding Example wherein the closed loop path comprises two or more linked spirals and occupies an area on the waveguide substrate less than or about equal to 5 $cm^2$.

EXAMPLE 8

The optical apparatus of Example 7 wherein at least a portion of one or more of the spirals comprises an Archimedean spiral.

EXAMPLE 9

The optical apparatus of any preceding Example wherein a transverse cross section of the optical waveguide comprises a dielectric material supported by pedestal of substrate material, wherein a lateral portion of the dielectric material extends transversely beyond the pedestal of the substrate material and an optical mode of the optical reference cavity is guided at least partly by an interface between the low dielectric material and an ambient medium at a lateral surface of the extended portion of the dielectric material.

EXAMPLE 10

The optical apparatus of Example 9 wherein the lateral surface of the dielectric material forms an acute angle with a bottom surface thereof.

EXAMPLE 11

The optical apparatus of any one of Examples 9 or 10 wherein the ambient medium is gaseous and comprises atmospheric or conditioned air, one or more inert gases, or near vacuum.

EXAMPLE 12

The optical apparatus of any one of Examples 9-11 wherein the substrate comprises one or more semiconductor materials and the dielectric material comprises one or more oxide materials.

EXAMPLE 13

The optical apparatus of any one of Examples 9-12 wherein the dielectric material comprises silica or doped silica between about 2 μm and about 10 μm thick, the substrate material comprises silicon or doped silicon, and the dielectric material extends transversely more than about 70 µm beyond the pedestal of the substrate material.

EXAMPLE 14

The optical apparatus of any one of Examples 9-13 wherein the optical waveguide exhibits optical loss less than or about equal to 0.2 dB/m for propagation of the optical mode along the optical waveguide.

EXAMPLE 15

The optical apparatus of any preceding Example further comprising (i) a laser source and (ii) a second optical waveguide that is arranged so as to couple optically a portion of an optical signal emitted by the laser source to the optical reference cavity.

EXAMPLE 16

The optical apparatus of Example 15 wherein the optical reference cavity and the second optical waveguide form a portion of a feedback mechanism arranged so as to lock an optical frequency of the optical signal to one of the resonance frequencies of the optical reference cavity.

EXAMPLE 17

The optical apparatus of any one of Examples 15 or 16 wherein the second optical waveguide is formed on the waveguide substrate.

EXAMPLE 18

The optical apparatus of Example 17 wherein the laser source is formed on the waveguide substrate.

EXAMPLE 19

A method employing the optical reference cavity of any preceding Example, the method comprising: (i) operating a laser source to produce an output optical signal; (ii) coupling a portion of the output optical signal to the optical reference cavity; (iii) generating an error signal based on the interaction of the coupled portion of the optical signal with the optical reference cavity; and (iv) controlling one or more operating parameters of the laser source based on the error signal so as to lock an optical frequency of the optical signal to one of the resonance frequencies of the optical reference cavity.

EXAMPLE 20

The method of Example 19 wherein a second optical waveguide couples the portion of the optical signal to the optical reference cavity.

EXAMPLE 21

The method of Example 20 wherein the second optical waveguide is formed on the waveguide substrate.

EXAMPLE 22

The method of Example 21 wherein the laser source is formed on the waveguide substrate.

It is intended that equivalents of the disclosed example embodiments and methods shall fall within the scope of the present disclosure or appended claims. It is intended that the disclosed exemplary embodiments and methods, and equivalents thereof, may be modified while remaining within the scope of the present disclosure or appended claims.

In the foregoing Detailed Description, various features may be grouped together in several exemplary embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed exemplary embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., sets of features that are not incompatible or mutually exclusive) that appear in the present disclosure or the appended claims, including those sets that may not be explicitly disclosed herein. It should be further noted that the scope of the appended claims do not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure or appended claims, the words "comprising," "including," "having," and variants thereof, wherever they appear, shall be construed as open ended terminology, with the same meaning as if the phrase "at least" were appended after each instance thereof.

In the appended claims, if the provisions of 35 USC §112 ¶6 are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112 ¶6 are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

One or more features or aspects of subject matter of the instant application may be related to or enabled by subject matter disclosed in one or more of the following additional references, each of which is incorporated by reference as if fully set forth herein:

J. Li, H. Lee, T. Chen, O. Painter and K. Vahala, "Chip-based Brillouin lasers as spectral purifiers for photonic systems," arXiv:1201.4212 (2012);

J. Li, H. Lee, T. Chen, O. Painter and K. Vahala, "Highly Coherent, Microcavity Brillouin Laser on Silicon," Frontiers in Optics Meeting, Paper # FTuD4 (2011);

T. Lu, H. Lee, T. Chen, S. Herchak, J. Kim, S. E. Fraser, R. C. Flagan and K. J. Vahala, "High sensitivity nanoparticle detection using optical microcavities," Proc Natl Acad Sci 108(15), 5976-5979 (2011);

Kippenberg, T. J. & Vahala, K. J., "Cavity optomechanics: Back-action at the mesoscale," Science 321, 1172-1176 (2008);

Kippenberg, T. J. & Vahala, K. J., "Cavity opto-mechanics," Optics Express 15, 17172-17205 (2007);

T. J. Kippenberg, J. Kalkman, A. Polman and K. J. Vahala, "Demonstration of an erbium-doped microdisk laser on a silicon chip," Physical Review A 74, 051802 (2006);

Kippenberg, T. J., Spillane, S. M., & Vahala, K. J., "Kerr-nonlinearity optical parametric oscillation in an ultra-high-Q toroid microcavity," Phys. Rev. Lett. 93, 083904 (2004);

S. M. Spillane, T. J. Kippenberg, O. J. Painter, and K. J. Vahala, "Ideality in a Fiber-Taper-Coupled Microresonator System for Application to Cavity Quantum Electrodynamics," Phys. Rev. Lett. 85, 043902, (2003);

K. J. Vahala, "Optical microcavities", Nature 424, 839-846 (2003);

Spillane, S. M., Kippenberg, T. J., Painter, O. J., & Vahala, K. J., "Ideality in a fiber-taper-coupled microresonator system for application to cavity quantum electrodynamics," Phys. Rev. Lett. 91, 043902 (2003).

M. Cai, O. Painter, & K. J. Vahala, "Observation of critical coupling in a fiber taper to a silica-microsphere whispering gallery mode system," Phys. Rev. Lett. 85, 74 (2000);

F. Quinlan, G. Yeas, S. Osterman, S. A. Diddams, Rev. of Sci. Instr. 8, 063105 (2010);

D. Braje, L. Hollberg, and S. Diddams, "Brillouin-enhanced hyperparametric generation of an optical frequency comb in a monolithic highly nonlinear fiber cavity pumped by a cw laser," Phys. Rev. Lett. 102, 193902 (2009);

A. A. Savchenkov, A. B. Matsko, D. Strekalov, M. Mohageg, V. S. Ilchenko, and L. Maleki, Phys. Rev. Lett. 93, 243905 (2004);

P. Del'Haye, A. Schliesser, O. Arcizet, T. Wilken, R. Holzwarth and T. J. Kippenberg, "Optical frequency comb generation from a monolithic microresonator," Nature 450, 1214 (2007);

A. A. Savchenkov, A. B. Matsko, V. S. Ilchenko, I. Solomatine, D. Seidel, and L. Maleki, "Tunable Optical Frequency Comb with a Crystalline Whispering Gallery Mode Resonator," Physical Review Letter 101, 093902 (2008);

I. S. Grudinin, N. Yu, and L. Maleki, Optics Letters 34, 878 (2009);

J. S. Levy, A. Gondarenko, M. A. Foster, A. C. Turner-Foster, A. L. Gaeta, and M. Lipson, "CMOS-compatible multiple-wavelength oscillator for on-chip optical interconnects," Nature Photon. 4, 37-40 (2010);

F. Ferdous, H. Miao, D. E. Leaird, K. Srinivasan, J. Wang, L. Chen, L. T. Varghese and A. M. Weiner, Nature Photonics 5, 770 (2011);

L. Razzari, D. Duchesne, M. Ferrera, R. Morandotti, S. Chu, B. E. Little, and D. J. Moss, "CMOS-compatible integrated optical hyperparametric oscillator," Nature Photon. 4, 41-45 (2010);

P. Del'Haye, T. Herr, E. Gavartin, M. L. Gorodetsky, R. Holzwarth, and T. J. Kippenberg, Phys. Rev. Lett. 107, 063901 (2011);

Y. Okawachi, K. Saha, J. S. Levy, Y. H. Wen, M. Lipson, and A. L. Gaeta, Opt. Lett. 36, 3398 (2011);

Del'Haye, P., Arcizet, O., Schliesser, A., Holzwarth, R., & Kippenberg, T. J., "Full stabilization of a microresonator frequency comb," Phys. Rev. Lett. 101, 053903 (2008);

A. R. Johnson, Y. Okawachi, J. S. Levy, J. Cardenas, K. Saha, M. Lipson, and A. L. Gaeta, Opt. Lett. 37, 875-877 (2012);

P. Del'Haye, O. Arcizet, M. L. Gorodetsky, R. Holzwarth, and T. J. Kippenberg, Nature Photonics 3, 529 (2009);

M. A. Foster, J. S. Levy, O. Kuzucu, K. Saha, M. Lipson, and A. L. Gaeta, Opt. Express 19, 14233 (2011);

I. S. Grudinin, N. Yu, and L. Maleki, "Generation of optical frequency combs with a $CaF_2$ resonator," Opt. Lett. 45, 878-880 (2009);

F. Vollmer and S. Arnold, "Whispering-gallery-mode biosensing: label-free detection down to single molecules," Nature Methods 5. 591-596 (2008);

R. Adar, M. Serbin, and Y. Mizrahi, "Less than 1 dB per meter propagation loss of silica waveguides measured using a ring resonator," J. Light. Tech. 12, 1369-1372 (1994);

T. Kominato, Y. Hida, M. Itoh, H. Takahashi, S. Sohma, T. Kitoh, and Y. Hibino, "Extremely low-loss (0.3 dB/m) and long silica-based waveguides with large width and clothoid curve connection," in Proceedings of ECOC (Stockholm, Sweden, 2004);

J. F. Bauters, M. J. R. Heck, D. John, D. Dai, M. Tien, J. S. Barton, A. Leinse, R. G. Heideman, D. J. Blumenthal, and J. E. Bowers. "Ultra-low-loss high-aspect-ratio $Si_3N_4$ waveguides," Optics Express 19, 3163-3174 (2011);

Matsko, A. B., Savchenkov, A. A., Yu, N. & Maleki, L., "Whispering-gallery-mode resonators as frequency references. I. fundamental limitations," J. Opt. Soc. Am. B 24, 1324-1335 (2007);

Savchenkov, A. A., Matsko, A. B., Ilchenko, V. S., Yu, N. & Maleki, L., "Whispering-gallery-mode resonators as frequency references. II. stabilization," J. Opt. Soc. Am. B 24, 2988-2997 (2007);

Matsko, A. B. & Ilchenko, V. S., "Optical resonators with whispering-gallery modes-part I: basics," IEEE J. Sel. Top. Quant. Electron. 12, 3-14 (2006);

Ilchenko, V. S. & Matsko, A. B., "Optical resonators with whispering-gallery modes-part II: applications," IEEE J. Sel. Top. Quant. Electron. 12, 15-32 (2006);

Grudinin, I. S., Matsko, A. B. & Maleki, L., "On the fundamental limits of Q factor of crystalline dielectric resonators," Optics Express 15, 3390-3395 (2007);

Savchenkov, A. A., Matsko, A. B., Ilchenko, V. S. & Maleki, L., "Optical resonators with ten million finesse," Optics Express 15, 6768-6773 (2007);

Aoki, T. et al., "Observation of strong coupling between one atom and a monolithic microresonator," Nature 442, 671-674 (2006);

Grudinin, I. S., Ilchenko, V. S. & Maleki, L., "Ultrahigh optical Q factors of crystalline resonators in the linear regime," Phys. Rev. A 74, 063806 (2006);

Tomes, M. & Carmon, T., "Photonic microelectromechanical systems vibrating at X-band (11-GHz) rates," Phys. Rev. Lett. 102, 113601 (2009);

Grudinin, I. S., Yu, N. & Maleki, L., "Brillouin lasing with a CaF2 whispering gallery mode resonator," Phys. Rev. Lett. 102, 043902 (2009);

Pant, R. et al., "Cavity enhanced stimulated Brillouin scattering in an optical chip for multiorder Stokes generation," Optics Letters 36, 3687-3689 (2011);

Vernooy, D. W., Ilchenko, V. S., Mabuchi, H., Streed, E. W., & Kimble, H. J., "High-Q measurements of fused silica microspheres in the near infrared," Optics Letters 23, 247-249 (1998);

Smith, S. P., Zarinetchi, F., & Ezekiel, S., "Narrow-linewidth stimulated brillouin fiber laser and applications," Optics Letters 16, 393-395 (1991);

Okawachi, Y. et al., "Tunable all-optical delays via brillouin slow light in an optical fiber," Phys. Rev. Lett. 94, 153902 (2005);

Zhu, Z., Dawes, A., Gauthier, D., Zhang, L., & Willner, A., "Broadband SBS slow light in an optical fiber," Journal of Lightwave Technology 25, 201-206 (2007);

Zhu, Z., Gauthier, D., & Boyd, R., "Stored light in an optical fiber via stimulated brillouin scattering," Science 318, 1748-1750 (2007);

Schliesser, A., Riviere, R., Anetsberger, G., Arcizet, O., & Kippenberg, T. J., "Resolved-sideband cooling of a micromechanical oscillator," Nature Physics 4, 415-419 (2008);

Tkach, R. W., Chraplyvy, A. R., & Derosier, R. M., "Spontaneous Brillouin scattering for single-mode optical-fibre characterization," Electron. Lett. 22, 1011-1013 (1986);

Ciminelli, C., Dell'Olio, F., Campanella, C., & Armenise, M., "Photonic technologies for angular velocity sensing," Adv. Opt. Photon. 2, 370-404 (2010);

Ciminelli, C., Passaro, V., Dell'Olio, F., & Armenise, M., "Three-dimensional modelling of scattering loss in In—GaAsP/InP and silica-on-silicon bent waveguides," J. Eur. Opt. Soc. Rapid Publ. 4, 1-6 (2009);

Anetsberger, G., Riviere. R., Schliesser A., Arcizet, O., & Kippenberg, T. J., "Ultralow-dissipation optomechanical resonators on a chip," Nature Photonics 2, 627-633 (2011).

Tien, M. C. et al., "Ultra-high quality factor planar Si3N4 ring resonators on Si substrates," Optics Express 19, 13551-13556 (2011);

Barwicz, T. & Haus, H., "Three-dimensional analysis of scattering losses due to sidewall roughness in microphotonic waveguides," J. Lightwave Technol. 23, 2719-2732 (2005); and Payne, F. & Lacey, J. A., "Theoretical analysis of scattering loss from planar optical waveguides," Opt. Quantum. Electron. 26, 977-986 (1994).

What is claimed is:

1. An optical apparatus comprising:
    (a) a waveguide substrate; and
    (b) an optical reference cavity that (i) exhibits multiple resonance frequencies over an operational wavelength range and (ii) can be characterized over the operational wavelength range by a Q-factor and a RMS resonance frequency fluctuation,
wherein:
    (c) the optical reference cavity comprises an optical waveguide formed on the waveguide substrate and arranged to form a closed loop greater than or about equal to 10 cm in length; and
    (d) the RMS resonance frequency fluctuation is less than or about equal to 100 Hz.

2. The optical apparatus of claim 1 wherein:
    (c') the optical reference cavity comprises an optical waveguide formed on the waveguide substrate and arranged to form a closed loop greater than or about equal to 2 meters in length;
    (d') the RMS resonance frequency fluctuation is less than or about equal to 20 Hz; or
    (e') the Q-factor is greater than or about equal to $2\times10^8$.

3. The optical apparatus of claim 1 wherein:
    (c') the optical reference cavity comprises an optical waveguide formed on the waveguide substrate and arranged to form a closed loop greater than or about equal to 10 meters in length;
    (d') the RMS resonance frequency fluctuation is less than or about equal to 10 Hz; or
    (e') the Q-factor is greater than or about equal to $5\times10^8$.

4. The optical apparatus of claim 1 wherein the Q-factor is greater than or about equal to $10^8$.

5. The optical apparatus of claim 1 wherein the optical reference cavity comprises an optical waveguide formed on the waveguide substrate and arranged to form a closed loop greater than or about equal to 1 meter in length.

6. The optical apparatus of claim 5 wherein the optical waveguide exhibits optical loss less than or about equal to 0.2 dB/m for propagation of an optical signal along the optical waveguide.

7. The optical apparatus of claim 5 wherein the closed loop path comprises two or more linked spirals and occupies an area on the waveguide substrate less than or about equal to 5 cm$^2$.

8. The optical apparatus of claim 7 wherein at least a portion of one or more of the spirals comprises an Archimedean spiral.

9. The optical apparatus of claim 1 wherein a transverse cross section of the optical waveguide comprises a dielectric material supported by pedestal of substrate material, wherein a lateral portion of the dielectric material extends transversely beyond the pedestal of the substrate material and an optical mode of the optical reference cavity is guided at least partly by an interface between the low dielectric material and an ambient medium at a lateral surface of the extended portion of the dielectric material.

10. The optical apparatus of claim 9 wherein the lateral surface of the dielectric material forms an acute angle with a bottom surface thereof.

11. The optical apparatus of claim 9 wherein the ambient medium is gaseous and comprises atmospheric or conditioned air, one or more inert gases, or near vacuum.

12. The optical apparatus of claim 9 wherein the substrate comprises one or more semiconductor materials and the dielectric material comprises one or more oxide materials.

13. The optical apparatus of claim 9 wherein the dielectric material comprises silica or doped silica between about 2 μm and about 10 μm thick, the substrate material comprises silicon or doped silicon, and the dielectric material extends transversely more than about 70 μm beyond the pedestal of the substrate material.

14. The optical apparatus of claim 9 wherein the optical waveguide exhibits optical loss less than or about equal to 0.2 dB/m for propagation of the optical mode along the optical waveguide.

15. The optical apparatus of claim 1 further comprising (i) a laser source and (ii) a second optical waveguide that is arranged so as to couple optically a portion of an optical signal emitted by the laser source to the optical reference cavity.

16. The optical apparatus of claim 15 wherein the optical reference cavity and the second optical waveguide form a portion of a feedback mechanism arranged so as to lock an optical frequency of the optical signal to one of the resonance frequencies of the optical reference cavity.

17. The optical apparatus of claim 15 wherein the second optical waveguide is formed on the waveguide substrate.

18. The optical apparatus of claim 17 wherein the laser source is formed on the waveguide substrate.

19. A method employing the optical reference cavity of claim 1, the method comprising:
   (i) operating a laser source to produce an output optical signal;
   (ii) coupling a portion of the output optical signal to the optical reference cavity;
   (iii) generating an error signal based on the interaction of the coupled portion of the optical signal with the optical reference cavity; and
   (iv) controlling one or more operating parameters of the laser source based on the error signal so as to lock an optical frequency of the optical signal to one of the resonance frequencies of the optical reference cavity.

20. The method of claim 19 wherein a second optical waveguide couples the portion of the optical signal to the optical reference cavity.

21. The method of claim 20 wherein the second optical waveguide is formed on the waveguide substrate.

22. The method of claim 21 wherein the laser source is formed on the waveguide substrate.

* * * * *